(12) United States Patent
Akita et al.

(10) Patent No.: US 7,547,910 B2
(45) Date of Patent: Jun. 16, 2009

(54) SEMICONDUCTOR LIGHT-EMITTING DEVICE AND METHOD OF MANUFACTURING SEMICONDUCTOR LIGHT-EMITTING DEVICE

(75) Inventors: Katsushi Akita, Itami (JP); Yusuke Yoshizumi, Itami (JP); Takashi Kyono, Itami (JP); Hiroyuki Kitabayashi, Osaka (JP); Koji Katayama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/863,220

(22) Filed: Sep. 27, 2007

(65) Prior Publication Data

US 2008/0023708 A1 Jan. 31, 2008

(51) Int. Cl.
*H01L 29/06* (2006.01)
(52) U.S. Cl. ............... 257/14; 257/9; 257/94; 257/96; 257/102; 257/E29.072; 257/E29.168; 257/E29.248; 257/E33.008; 257/E33.033; 257/E33.065
(58) Field of Classification Search .................... 257/94, 257/9, 14, E33.032, E29.089, E21.108, 96, 257/102, E29.072, E29.168, E29.248, E33.008, 257/E33.033, E33.065, E33.067, E33.07, 257/E29.069
See application file for complete search history.

(56) References Cited

U.S. PATENT DOCUMENTS

2008/0149955 A1* 6/2008 Nakamura et al. ............ 257/96

FOREIGN PATENT DOCUMENTS

| JP | H06-268257 A | 9/1994 |
| JP | H08-316528 A | 11/1996 |
| JP | 2000-133883 A | 5/2000 |

OTHER PUBLICATIONS

Motokazu Yamada et al., "InGaN-Based Near-Ultraviolet and Blue-Light-Emitting Diodes with High External Quantum Efficiency Using a Patterned Sapphire Substrate and a Mesh Electrode," Japanese Journal of Applied Physics, Dec. 15, 2002, pp. L1431-L1433, vol. 41(2002), The Japan Society of Applied Physics, Tokyo.

(Continued)

*Primary Examiner*—Long K Tran
(74) *Attorney, Agent, or Firm*—James W. Judge

(57) ABSTRACT

Affords a semiconductor light-emitting device in which a decrease in external quantum efficiency has been minimized even at high current densities. In a semiconductor light-emitting device (11), a gallium nitride cladding layer (13) has a threading dislocation density of $1\times10^7$ cm$^{-2}$ or less. An active region (17) has a quantum well structure (17*a*) consisted of a plurality of well layers (19) and a plurality of barrier layers (21), and the quantum well structure (17*a*) is provided so as to emit light having a peak wavelength within the wavelength range of 420 nm to 490 nm inclusive. The well layers (19) each include an un-doped $In_XGa_{1-X}N$ ($0<X<0.14$, X: strained composition) region. The barrier layers (21) include an un-doped $In_YGa_{1-Y}N$ ($0\leq Y\leq 0.05$, Y: strained composition, Y<X) region. Herein, indium composition X is indicated as strained composition, not as relaxation composition, in the embodiments of the present invention.

6 Claims, 8 Drawing Sheets

OTHER PUBLICATIONS

A. Y. Kim et al., "Performance of High-Power AlInGaN Light Emitting Diodes," Physica Status Solidi (a), Nov. 2001, pp. 15-21, vol. 188, No. 1, Wiley-VCH, Berlin.

T. Wang et al., "Investigation of the Emission Mechanism in InGaN/GaN-based Light-emitting Diodes," Applied Physics Letters, Apr. 30, 2001, pp. 2617-2619, vol. 78, No. 18, American Institute of Physics, NY.

Katsushi Akita et al., "Characteristics of InGaN Light-Emitting Diodes on GaN Substrates with Low Threading Dislocation Densities," Physica Status Solidi (a), Jan. 2007, pp. 246-250, vol. 204, No. 1, Wiley-VCH, Berlin.

Katsushi Akita et al., "Improvements of External Quantum Efficiency of InGaN-based Blue Light-emitting Diodes at High Current Density Using GaN substrates," Journal of Applied Physics, Feb. 1, 2007, pp. 033104-1 through 033104-5, vol. 101, American Institute of Physics, NY.

* cited by examiner

SEMICONDUCTOR LIGHT-EMITTING DEVICE AND METHOD OF MANUFACTURING SEMICONDUCTOR LIGHT-EMITTING DEVICE

BACKGROUND OF THE INVENTION

1. Technical Field

The present invention relates to semiconductor light-emitting devices and to methods of manufacturing semiconductor light-emitting devices.

2. Description of the Related Art

In Japanese Unexamined Pat. App. No. H06-268257, a gallium-nitride-based compound semiconductor light-emitting device employing a sapphire substrate is described. An object of the invention set forth in Pat. App. Pub. No. H06-268257 is to afford a nitride semiconductor light-emitting device in which a multilayer film stack composed of well and barrier layers of equal thickness is rendered a single emission layer to mitigate lattice mismatch and improve the crystallinity of the emission layer. In Embodiment 1 of the publication, the barrier and well layers are grown at 800 degrees centigrade. The well layers are composed of 2-nm thick $In_{0.2}Ga_{0.8}N$, while the barrier layers are composed of 2-nm thick $In_{0.04}Ga_{0.96}N$. In Embodiment 2 of the publication, the barrier and well layers are grown at 800 degrees centigrade. The well layers are composed of 5-nm thick $In_{0.2}Ga_{0.8}N$, while the barrier layers are composed of 5-nm thick $In_{0.04}Ga_{0.96}N$.

Japanese Unexamined Pat. App. Pub. No. H08-316528 describes a nitride semiconductor light-emitting device employing a sapphire substrate. The invention set forth in Pat. App. Pub. No. H08-316528 is directed to making available not only green LEDs, but also nitride semiconductor light-emitting devices that exhibit high brightness and high output power at emission wavelengths of 360 nm or more. A nitride semiconductor light-emitting device of Embodiment 10 therein has a quantum-well structure consisting of 1-nm thick undoped $In_{0.15}Ga_{0.85}N$ well layers, and of 1-nm thick undoped $In_{0.05}Ga_{0.95}N$ barrier layers. A nitride semiconductor light-emitting device of Embodiment 11 of the publication has a quantum-well structure consisting of 2.5-nm thick undoped $In_{0.15}Ga_{0.85}N$ well layers, and of 5-nm thick undoped $In_{0.05}Ga_{0.95}N$ barrier layers. These nitride semiconductor light-emitting devices have emission wavelength of 415 nm.

Increasing the indium composition in the active layer harms the crystallinity, which is prohibitive of obtaining inter-band emission of green light at a wavelength in the vicinity of 520 nm. In the foregoing nitride semiconductor light-emitting devices, however, band-gap energy of the active layer is smaller than its original band-gap energy because tensile stress is applied to the active layer, with the high-thermal-expansion-coefficient active layer intervening between low-thermal-expansion-coefficient cladding layers.

For this reason, the well layers in the light-emitting devices cannot be made thick.

Japanese Unexamined Pat. App. Pub. No. 2000-133883 describes a nitride semiconductor light-emitting device employing a sapphire substrate. An object of the invention set forth in Pat. App. Pub. No. 2000-133883 is to make available a nitride semiconductor light-emitting device enabling enhancement of photoelectric conversion efficiency without diminishing optical output power. In the embodiments therein, barrier and well layers are grown at 800 degrees centigrade. The well layers are composed of 3-nm thick $In_{0.3}Ga_{0.7}N$, and the barrier layers are composed of 30-nm thick Si-doped GaN.

In *Japanese Journal of Applied Physics*, Vol. 41, 2002, pp. L1431-L1433, a blue LED structure is described. For this blue LED structure, a low-temperature GaN buffer layer, undoped GaN layer, n-type GaN layer, MQW active layers, p-type AlGaN layer, and p-type GaN layer are formed by MOCVD successively onto a patterned c-plane sapphire substrate. The MQW structure is composed of 3-nm thick undoped $In_{0.3}Ga_{0.7}N$ well layers, and of 25-nm thick undoped GaN barrier layers. The p-electrode is composed of Rh/Ir/Pt in mesh form. The blue LED structure is encapsulated with epoxy resin.

When a current of 20 mA (current density being 105 A/cm² directly under the mesh electrode, and 39 A/cm² in the active layer) is applied through a mesh electrode having a 70% aperture ratio, an output power of 18.8 mW is generated, and an external quantum efficiency of 34.9% is achieved. On the other hand, when a current of 10 mA (current density in the active layer being 195 A/cm²) is applied through the mesh electrode, an output power of 65 mW is generated, but nevertheless the external quantum efficiency drops to 25%.

*Physica Status Solidi (a)*, Vol. 188, No. 1, 2001, pp. 15-21 describes a light-emitting diode of quantum well structure. The light-emitting diode is composed of a nucleation layer formed on the c-plane of a sapphire substrate at low temperature, an underlayer doped with Si, a MQW emission layer composed of InGaN/GaN, a p-type AlGaN layer, and a p-type GaN layer. A chip (area: 0.0007 cm²) that exhibits wavelengths of 428 nm, 454 nm, 501 nm, and 545 nm is flip-flop mounted, and 1-kHz pulse current with duty ratio of 1% is applied to the chip. When the current density is 12.5 A/cm² (0.0875 A), power efficiency rises to 28% at the most efficient wavelength of 428 nm. On the other hand, when the current density is 125 A/cm², the power efficiency drops to a level of 18%.

In *Applied Physics Letters*, Vol. 78, 2001, p. 2617, an InGaN/GaN-based light-emitting diode is described. According to this reference, in the InGaN-based light-emitting diode, an increase in well-layer thickness diminishes LED output power.

In the above-cited references, when the density of current applied to the light-emitting devices is low, their external quantum efficiency is high. The external quantum efficiency, however, decreases with increasing current density. In blue light-emitting diodes (of from 420 nm to 490 nm wavelength) employing an InGaN-based active layer, high emission efficiency is obtained at low current densities. A possible reason explaining such a result is that the contribution of localized energy levels originating in indium compositional fluctuations to device emission leads to high emission efficiency. In other words, the potential also varies spatially depending on the spatial variations (fluctuations) of the indium composition in the InGaN-based active layer. An increase in the current density, however, causes carriers to overflow from the localized energy levels, causing the regions surrounding the localized energy levels to contribute to emission. This is responsible for a decrease in the emission efficiency as a whole at high current densities.

According to results of studies on how to minimize decrease in emission efficiency, it is desirable to lessen fluctuations in the indium composition in the InGaN layer, in order to minimize decrease in emission efficiency at high current densities. Lowering the indium composition will reduce fluctuations in indium composition. But merely lowering the indium composition to reduce indium compositional fluctuations causes the emission wavelength to shift from the desired wavelength.

In order to have light-emitting devices emit light at desired wavelength the InGaN well layer thickness must be increased, in addition to lowering the indium composition. Nevertheless, as described in *Applied Physics Letters*, Vol. 78, 2001, p. 2617 and other cited literature, it is well known that in InGaN-based light-emitting diodes employing a (0001) sapphire substrate, an increase in the well-layer thickness causes LED output power to diminish.

BRIEF SUMMARY OF THE INVENTION

The present invention has been brought about taking the foregoing issues into consideration, and an object of the invention is to make available semiconductor light-emitting devices in which the decrease in external quantum efficiency is minimized even at high current densities, and to make available methods of manufacturing such semiconductor light-emitting devices.

One aspect of the present invention is a semiconductor light-emitting device including: (a) a gallium nitride cladding layer of a first conductivity type, with a threading dislocation density of $1\times10^7$ cm$^{-2}$ or less; (b) a gallium nitride cladding layer of a second conductivity type; (c) an active region, having a quantum well structure consisted of a plurality of well layers and a plurality of barrier layers, provided between the first-conductivity-type and the second-conductivity-type gallium nitride cladding layers, the quantum well structure being provided so as to emit light having a peak wavelength within the wavelength range from 420 nm to 490 nm inclusive, with an un-doped $In_XGa_{1-X}N$ (0<X<0.14, X: strained composition) region being included in the well layers each, and with an un-doped $In_YGa_{1-Y}N$ (0<Y<0.05, Y: strained composition, Y<X) region being included in the barrier layers.

According to the semiconductor light-emitting device, the localized levels originating in the In compositional fluctuations reduces in the well layers because In composition X in the well layers is small. The reduction of the localized levels makes the active region sensitive to threading dislocation density. Furthermore, just lowering the In composition X causes emission wavelength to shift. The well layers are hence made thick in order to emit light having a wavelength within the wavelength range of 420 nm to 490 nm inclusive without the emission wavelength shifting. Thickening the well layers, however, spoils crystallinity of the InGaN well layers. To lessen the impact of the active regions' sensitivity to dislocations, and of thickening the well layers, the active region is provided on an underlayer with a threading dislocation density of $1\times10^7$ cm$^{-2}$ or less. As a result, the decrease in external quantum efficiency at high current densities can be curbed.

The invention in another aspect is a semiconductor light-emitting device includes: (a) a first-conductivity-type gallium nitride cladding layer with a threading dislocation density of $1\times10^7$ cm$^{-2}$ or less; (b) a second-conductivity-type gallium nitride cladding layer; (c) an active region, having a quantum well structure consisted of a plurality of well layers and a plurality of barrier layers, provided between the first-conductivity-type and the second-conductivity-type gallium nitride cladding layers, the quantum well structure being provided so as to emit light having a peak wavelength within the wavelength range of 420 nm to 490 nm inclusive, with an un-doped $In_XGa_{1-X}N$ (0<X<0.14, X: strained composition) region being included in the well layers each, and with an $In_YGa_{1-Y}N$ (0≦Y≦0.05, Y: strained composition, Y<X) region to which a n-type dopant is added being included in the barrier layers.

In such a semiconductor light-emitting device, the localized levels originating in the In compositional fluctuations reduces in the well layers because the In composition X in the well layers is small. The reduction of the localized levels makes the active region sensitive to threading dislocation density. Furthermore, just lowering the In composition X causes emission wavelength to shift. The well layers are hence made thick in order to emit light having a wavelength within the wavelength range of 420 nm to 490 nm inclusive without the emission wavelength shifting. Thickening the well layers, however, spoils crystallinity of the InGaN well layers. Moreover, the thicker InGaN well layers raises forward voltage $V_f$. To lessen the impact of the active regions' sensitivity to dislocations, and of thickening the well layers, the active region is provided on an underlayer with a threading dislocation density of $1\times10^7$ cm$^{-2}$ or less. In addition, the rise in the forward voltage $V_f$ can be limited by doping Si to the barrier layers. As a result, the decrease in external quantum efficiency at high current densities can be curbed.

In the semiconductor light-emitting devices involving the present invention, the well layer thickness is preferably 4 nm or more, and is preferably 10 nm or less.

It is believed that in these semiconductor light-emitting devices, increasing the InGaN well layer thickness prevents an occurrence of the decease in external quantum efficiency at high current densities.

The semiconductor light-emitting devices involving the present invention further comprises (d) a III-nitride substrate having the basal plane, with a semiconductor region consisted of the first-conductivity-type gallium nitride cladding layer, active region and second-conductivity-type gallium nitride cladding layer being provided on the III-nitride substrate basal plane.

According to such semiconductor light-emitting devices, because the substrate is composed of III-nitride semiconductor, there is less difference between lattice constants of the substrate and the well layer InGaN. As a result, degradation of the InGaN well layer crystallinity can be prevented.

In the semiconductor light-emitting devices involving the present invention, the III-nitride substrate is preferably $1\times10^7$ cm$^{-2}$ or less in threading dislocation density. In the situation in which the substrate threading dislocation density in the semiconductor light-emitting devices is $1\times10^7$ cm$^{-2}$ or less, the number of threading dislocations passed to InGaN crystals of the underlayer and well layers reduces, and thus the degradation of the InGaN well layer crystallinity can be minimized even if the InGaN well layer thickness is increased.

The III-nitride substrate in the semiconductor light-emitting devices involving the present invention is preferably a gallium nitride substrate with a threading dislocation density of $1\times10^7$ cm$^{-2}$ or less. In the situation in which the threading dislocation density of the gallium nitride substrate in the semiconductor light-emitting devices is $1\times10^7$ cm$^{-2}$ or less, the number of threading dislocations passed to InGaN crystals of the underlayer and well layers reduces, and thus the degradation of the InGaN well layer crystallinity can be minimized even if the InGaN well layer thickness is increased.

A further aspect of the present invention is a method of manufacturing the semiconductor light-emitting devices. The manufacturing method comprises (a) a step of forming on a gallium nitride cladding region whose threading dislocation density is $1\times10^7$ cm$^{-2}$ or less an active layer having a quantum well structure provided so as to emit light with a peak wavelength of 420 nm to 490 nm inclusive, with an un-doped $In_XGa_{1-X}N$ (0<X<0.14, X: strained composition) region being included in the well layers of, and with an un-doped $In_YGa_{1-Y}N$ ($0 \leq Y \leq 0.05$, Y: strained composition, Y<X) region being included in the barrier layers of, the quantum well structure, wherein the temperature at which the well layers are deposited is lower than that at which the barrier layers are deposited.

With this method, the In compositional fluctuations can be curbed by making the temperature at which the well layers are deposited lower than that at which the barrier layers are deposited, and by making the well layer In composition small. As a result, the external quantum efficiency at high current densities is kept from decreasing. Lowering the well layer In composition reduces the number of the localized levels originating in the In compositional fluctuations. The reduction of the localized levels, however, causes the active layer to seriously suffer the impact of dislocations. That is to say, the crystallinity of the active region becomes sensitive to the threading dislocation densities of the active region and underlayer. Furthermore, just lowering the In compositions of the well layers results in the emission wavelength shifting. Preventing this shifting, and emitting light with a wavelength of 420 nm and 490 nm inclusive, require increasing the well layer thickness. Nevertheless, thickening the well layers spoils the InGaN well layer crystallinity. In order to lessen the impact of the active regions' sensitivity to dislocations, and of thickening the well layers, the threading dislocation density of the underlayer is brought to $1 \times 10^7$ cm$^{-2}$ or less.

The yet another aspect of the present invention is a semiconductor light-emitting device manufacturing method, which comprises (a) a step of forming on a gallium nitride cladding region whose threading dislocation density is $1 \times 10^7$ cm$^{-2}$ or less an active layer having a quantum well structure provided so as to emit light with a peak a wavelength of 420 nm to 490 nm inclusive, with an un-doped $In_XGa_{1-X}N$ (0<X<0.14, X: strained composition) region being included in the well layers of, and with an un-doped $In_YGa_{1-Y}N$ ($0 \leq Y \leq 0.05$, Y: strained composition, Y<X) region to which an n-type dopant is added being included in the barrier layers of, the quantum well structure, wherein the temperature at which the well layers are deposited is lower than that at which the barrier layers are deposited.

With such a method, the In compositional fluctuations can be curbed by making the temperature at which the well layers are deposited lower than that at which the barrier layers are deposited, and by making the well layer In composition small. As a result, the external quantum efficiency at high current densities is kept from decreasing. Lowering the well layer In composition reduces the number of the localized levels originating in the In compositional fluctuations. The reduction of the localized levels, however, causes the active layer to seriously suffer the impact of dislocations. That is to say, the crystallinity of the active region becomes sensitive to the threading dislocation densities of the active region and underlayer. Furthermore, just lowering the In compositions of the well layers results in the emission wavelength shifting. In order to prevent this shifting and to emit light with a wavelength of 420 nm and 490 nm inclusive, the well layer thickness is increased. Nevertheless, thickening the well layers spoils the InGaN well layer crystallinity. The impact of the active regions' sensitivity to dislocations and of thickening the well layers can be lessened by bringing the threading dislocation density of the underlayer to $1 \times 10^7$ cm$^{-2}$ or less. Moreover, although the increase in InGaN thickness raises the forward voltage $V_f$, the rise in the forward voltage $V_f$ can be minimized by doping Si to the barrier layers.

In the methods involving the present invention, the well layer thickness is preferably 4 nm or more, and preferably is 10 nm or less. It is believed that with the methods, increasing the InGaN well layer thickness prevents the decrease in external quantum efficiency at high current densities from occurring.

The methods involving the present invention may further comprise (b) a step of growing the gallium nitride cladding region on the III-nitride substrate. According to the methods, because the substrate is composed of III-nitride semiconductor, there is less difference between lattice constants of the substrate and the well layer InGaN. As a result, degradation of the InGaN well layer crystallinity can be curbed.

In the methods involving the present invention, the threading dislocation density of the III-nitride substrate is preferably $1 \times 10^7$ cm$^{-2}$ or less. With the methods, in the situation in which the substrate threading dislocation density is $1 \times 10^7$ cm$^{-2}$ or less, the number of threading dislocations passed to InGaN crystals of the underlayer and well layers is reduced, and thus the impact of the treading dislocations on the InGaN well layer crystallinity can be lessened even if the InGaN well layers are made thick.

The III-nitride substrate is preferably a gallium nitride substrate with a dislocation density of $1 \times 10^7$ cm$^{-2}$ or less in the methods involving the present invention. In the methods, because the treading dislocation density of the gallium nitride substrate is $1 \times 10^7$ cm$^{-2}$ or less, the number of the trading dislocations in the InGaN crystals of the well layers reduces, so that the degradation of the InGaN well layer crystallinity can be minimized.

Above and other objects, features and advantages of the present invention will be clarified more readily from the following description of the best modes by which the present invention can be adopted, with reference to the accompanying drawings.

As just described, the present invention affords semiconductor light-emitting devices in which the decrease in external quantum efficiency has been minimized even at high current densities, and affords methods of manufacturing the semiconductor light-emitting devices.

DETAILED DESCRIPTION OF THE INVENTION

The findings in the present invention can be understood simply by considering the following detailed description with reference to the accompanying drawings illustrated as examples. Continuously, while referring the accompanying drawings, an explanation of embodiments involving the semiconductor light-emitting devices and their manufacturing methods of the present invention will be made. Where possible, like elements are labeled with identical reference marks.

EMBODIMENT 1

Figure 1:
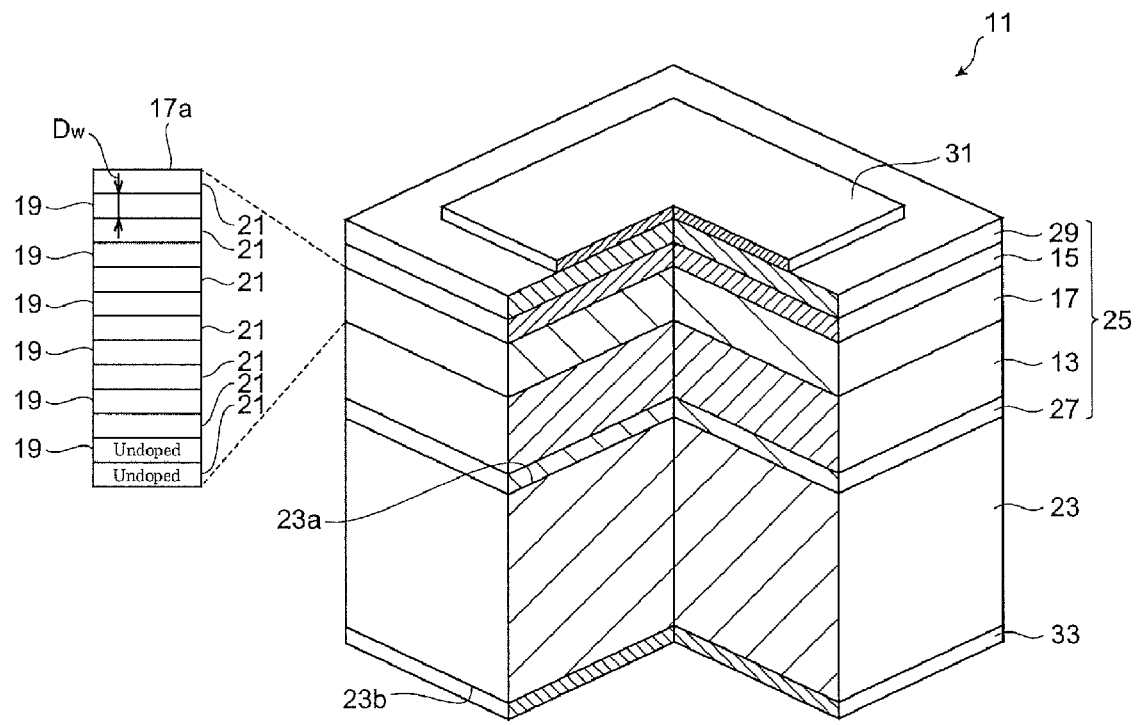
FIG. 1 is a diagram illustrating a semiconductor light-emitting device involving one embodiment of the present invention.

FIG. 1 is a drawing illustrating a semiconductor light-emitting device involving this embodiment. The semiconductor light-emitting device may be light-emitting diode, for example. A semiconductor light-emitting device 11 includes a gallium nitride cladding layer 13 of a first conductivity type, a gallium nitride cladding layer 15 of a second conductivity type, and an active region 17. The gallium nitride cladding layer 13 has a threading dislocation density of $1 \times 10^7$ cm⁻² or less. The Active region 17 is provided between the first-conductivity-type gallium nitride cladding layer 13 and the second-conductivity-type gallium nitride cladding layer 15. The active region 17 has a quantum well structure 17a consisted of a plurality of well layers 19 and a plurality of barrier layers 21, and additionally the quantum well structure 17a is provided so as to emit light having a peak wavelength within the wavelength range of 420 nm to 490 nm inclusive. The well layers each include an un-doped $In_XGa_{1-X}N$ (0<X<0.14, X: strained composition) region. The barrier layers 21 include an un-doped $In_YGa_{1-Y}N$ (0≦Y≦0.05, Y: strained composition, Y<X) region. Herein, in this embodiment, indium composition X is represented as a strained composition, and is not a relaxation composition. A strained composition is a hypothetical composition in which being coordinate with a-axis of a seed crystal, crystals strain, and the relaxation composition means a hypothetical composition in which being free of the influence of the seed crystal, the crystals do not strain.

According to the semiconductor light-emitting device 11, because In composition (0<X<0.14, X: strained composition) of the well layers 19 is small, spatial fluctuations of In composition X is curbed, and thus the number of the localized levels originating in the fluctuations reduces. The reduction of the localized levels, however, causes the active region to seriously suffer the impact of the dislocations instead. That is to say, crystallinity of the thick well layers 19 becomes sensitive more than ever to the threading dislocation density of the active region 17 and an underlayer (for example, the region 13). Furthermore, just lowering the In composition X of the well layers 19 results in that emission wavelength shifts. In order to obtain light having a wavelength within the wavelength range of 420 nm to 490 nm inclusive without the emission wavelength shifting, thickness $D_w$ of the well layers 19 is increased. Increasing the thickness $D_w$ of the well layers 19, however, spoils the crystallinity of the well layers 19. To lessen the impact of the active regions' sensitivity to dislocations, and of thickening the well layers 19, the active region 17 is provided on the underlayer having a threading dislocation density of $1 \times 10^7$ cm⁻² or less. As a result, a decrease in external quantum efficiency of the semiconductor light-emitting device 11 can be minimized at high current densities.

In the semiconductor light-emitting device 11, band-gap energy of the gallium nitride cladding layer 13 and gallium nitride layer 15 is larger than that of the well layers 19. The gallium nitride cladding layer 13 is composed of, for example, GaN and AlGaN. The gallium nitride cladding layer 15 is composed of, for example, AlGaN and GaN.

Although in most blue light emitting diodes, as well layer thickness, 3 nm is commonly adopted, the well layers 19 are preferably 4 nm or more in thickness because the indium compositions are lowered. The advantage of bringing the thickness to 4 nm or more is that a decrease in external quantum efficiency is minimized. Furthermore, the well layers 19 are preferably 10 nm or less in thickness.

The advantage of making the thickness 10 nm or less is that crystallinity of the InGaN well layers improves. In such a semiconductor light-emitting device, thickening the InGaN well layers 19 reduces the In compositional fluctuations in the made thick InGaN well layers, and on the other hand, increases in the whole made thick well layers the total number of the localized levels caused by the In compositional fluctuations. It is believed that the reduction of the In compositional fluctuations and the increase in localized levels in the whole well layers enable maintaining the external quantum efficiency at low current densities, and prevent the decrease in external quantum efficiency at high current densities from occurring. There is a possibility that increasing the thickness $D_w$ of the InGaN well layers 19 spoils the crystallinity of the InGaN well layers 19, but the degradation of the crystallinity of the InGaN well layers 19 is curbed because the threading dislocation density of the underlayer is $1 \times 10^7$ cm⁻² or less.

The semiconductor light-emitting device 11 may further comprise a III-nitride substrate 23. Because the substrate is composed of III-nitride semiconductor, there is less difference between the lattice constants of the InGaN of the well layers 19 and the substrate 23. The crystallinity degradation in the InGaN well layers 19 is hence curbed. Furthermore, the III-nitride substrate 23 is preferably $1 \times 10^7$ cm⁻² or less in threading dislocation density. In the semiconductor light-emitting device 11, the number of threading dislocations passed to the InGaN crystals in the underlayer and well layers 19 reduces at a dislocation density of the substrate 23 of $1 \times 10^7$ cm⁻² or less, and thus the crystallinity degradation in the InGaN well layers 19 can be minimized. The III-nitride substrate 23 is preferably a gallium nitride substrate. The gallium nitride substrate is composed of gallium nitride with a threading dislocation density of $1 \times 10^7$ cm⁻² or less. Growing the underlayer and well layers onto such a gallium nitride reduces the number of treading dislocations passed to the InGaN crystals, improving the crystallinity of the InGaN well layers.

A semiconductor region 25 is provided on the front side 23a of the III-nitride substrate 23. The semiconductor region 25 includes the gallium nitride cladding layer 13, active region 17, and gallium nitride cladding layer 15, and additionally includes a gallium nitride semiconductor intermediate layer 27 of a first conductivity type, and a contact layer 29 of a second conductivity type. The semiconductor light-emitting device 11 comprises a first ohmic electrode 31 provided on the second-conductivity-type contact layer 29, and a second ohmic electrode 33 provided on the back side 23b of the substrate 23.

Examples of the semiconductor light-emitting device 11 include a light-emitting diode composed of:
  the gallium nitride cladding layer 13: the n-GaN (doped with Si);
  the gallium nitride cladding layer 15: p-$Al_{0.12}Ga_{0.88}N$ (doped with Mg);
  the well layers 19 in the active region 17: $In_{0.11}Ga_{0.89}N$ (strained composition);
  the 5-nm thick barrier layers 21 in the active region 17: $In_{0.01}Ga_{0.99}N$ (strained composition);
  the 5-nm thick gallium nitride semiconductor intermediate layer 27: n-$Al_{0.12}Ga_{0.88}N$;
  the contact layer 29: p-GaN;
  the first ohmic electrode 31 (anode): Ni/Au (translucent electrode); and
  the second ohmic electrode 33 (cathode): Ti/Al.

Figure 2:
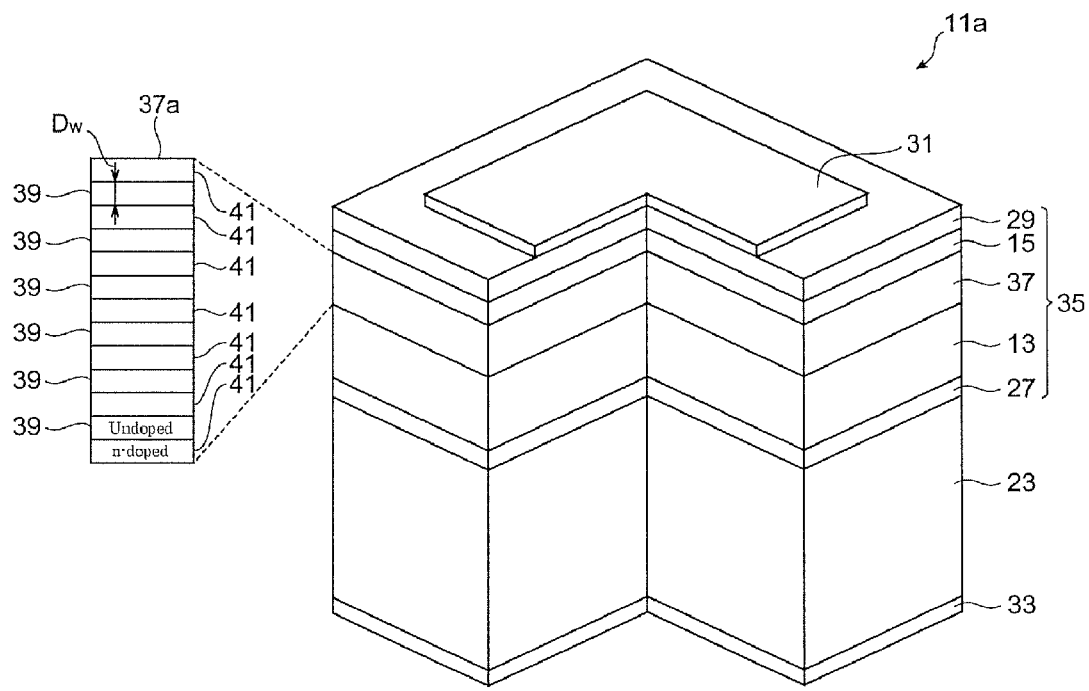
FIG. 2 is a diagram illustrating an example of the modified semiconductor light-emitting diode involving the embodiment of the present invention.

FIG. 2 is a drawing illustrating a modified form of the semiconductor light-emitting device involving this embodiment. A semiconductor light-emitting device 11a has an active region 37. The active region 37 has a quantum well structure 37a consisted of a plurality of well layers 39 and a plurality of barrier layers 41, and the quantum well structure 37a is provided so as to emit light having a peak wavelength within the wavelength region of 420 nm to 490 nm inclusive. The well layers 39 each include an un-doped $In_XGa_{1-X}N$ (0<X<0.14, X: strained composition) region. The barrier layers 41 include $In_YGa_{1-Y}N$ (0≦Y≦0.05, Y: strained composition, Y<X) region to which an n-type dopant is added. Indium compositions X and Y in this embodiment are indicated as strained composition, not as relaxation composition. A semiconductor region 35 is composed of the gallium nitride cladding layer 13, active region 37, and gallium nitride cladding layer 15, and additionally includes the first-conductivity gallium nitride semiconductor intermediate layer 27, and second-conductivity contact layer 29.

In the semiconductor light-emitting device 11a, lowering the In composition (0<X<0.14, X: strained composition) in the well layers 39 curbs spatial fluctuations of the In composition X, and reduces the number of the localized levels originating in the fluctuations. The reduction of the localized levels, however, causes the active region to seriously suffer the impact of the dislocations instead. That is to say, the crystallinity of the active region 37 becomes sensitive more than ever to the threading dislocation densities of the active region 37 and underlayer (for example, region 13). Furthermore, just lowering the In composition X in the well layers 39 results in the emission wavelength shifting. In order to obtain light within the wavelength range of 420 nm to 490 inclusive without the emission wavelength shifting, thickness $D_w$ of the well layers 39 is increased. Nevertheless, increasing the thickness $D_w$ of the well layers 39 spoils the crystallinity of the well layers 39. Moreover, the thicker InGaN well layers 39 raises the forward voltage $V_f$. To lessen the impact of the active regions' sensitivity to dislocations, and of thickening the well layers 39, the active region 37 is provided on the underlayer having a threading dislocation density of $1\times10^7$ $cm^{-2}$ or less, and doping the n-type dopant (for example, Si) to the barrier layers 41 lessens the rise in forward voltage $V_f$.

As a result, the decrease in the external quantum efficiency of the semiconductor light-emitting device 11a can be curbed at high current densities.

EXPERIMENTAL EXAMPLE 1

Preferred Example

A blue light emitting diode (with a wavelength of 420 nm to 490 nm inclusive) is produced by metal-organic vapor phase epitaxy. Trimethyl gallium (TMGa), trimethylammonium (TMAl), trimethyl indium (TMIn), ammonia ($NH_3$) monosilane ($SiH_4$), and cyclopentadienyl magnesium ($Cp_2Mg$) are available as raw materials.

A gallium nitride substrate having (0001) C plane is prepared. The gallium nitride substrate exhibits n-conductivity, and the substrate treading dislocation density is $1\times10^6$ $cm^{-2}$. The gallium nitride substrate is placed on a susceptor of the metal-organic vapor phase epitaxy reactor. Next, the gallium nitride substrate is subjected to thermal cleaning. Conditions for the thermo-cleaning are that ammonia gas ($NH_3$) and hydrogen gas ($H_2$) are supplied to the metal-organic vapor phase epitaxy reactor, and thermal treatment is performed for ten minutes at substrate temperature of 1050 degrees centigrade, with reactor pressure being controlled to be at 30 kPa.

Subsequently, film formation step is carried out. After the substrate temperature is made 1050 degrees centigrade and the reactor presser is changed to 101 kPa, an n-type $Al_{0.12}Ga_{0.88}N$ intermediate layer 50 nm in thickness is grown employing source gases (TMGa, TMAl, $NH_3$ and $SiH_4$). The substrate temperature is changed to 1100 degrees centigrade with the reactor pressure being kept 101 kPa, and then an n-type GaN buffer layer 2 μm in thickness is grown employing source gases (TMGa, $NH_3$ and $SiH_4$). The buffer layer growth rate is 4 μm/h. Next, barrier layers and well layers are grown alternately. In growing the barrier layers, the substrate temperature is changed to 900 degrees centigrade with the reactor pressure being kept 101 kPa, and then an un-doped $In_{0.01}Ga_{0.99}N$ layer 15 nm in thickness is deposited employing source gases (TMGa, TMIn, and $NH_3$). In growing the well layers, the substrate temperature is changed to 800 degrees centigrade with the reactor pressure being kept 101 kPa, and then a 5-nm thick un-doped $In_{0.11}Ga_{0.89}N$ layer 5 nm in thickness is deposited employing source gases (TMGa, TMIn, and $NH_3$). The well layer and barrier layer growths are repeated necessary times. In the embodiments of the present invention, a 6-growth-cycle quantum well structure is formed. The well layers and barrier layers are represented with strained compositions, and the strained compositional $In_{0.01}Ga_{0.99}N$ barrier layers and $In_{0.11}Ga_{0.89}N$ well layers are respectively the relaxation compositional $In_{0.02}Ga_{0.98}N$ barrier layers and $In_{0.17}Ga_{0.89}N$ well layers. They are often expressed by relaxation compositions. After that, the substrate temperature is changed to 1050 degrees centigrade with the reactor pressure being kept 101 kPa, and then a p-type $Al_{0.12}Ga_{0.88}N$ cladding layer 20 nm in thickness is grown employing source gases (TMGa, TMAl, $NH_3$ and $Cp_2Mg$). Subsequently, a p-type GaN contact layer 150 nm in thickness is grown employing source gases (TMGa, $NH_3$ and $Cp_2Mg$). As a result, a LED epitaxial substrate is completed.

Subsequently, the LED epitaxial substrate is removed from the metal-organic vapor phase epitaxy reactor, and an anode of a transparent electrode is created on the p-type contact layer. The size of the transparent electrode is 400 μm square (electrode area: $1.6\times10^{-3}$ $cm^2$). Additionally, an electrode of a cathode is created on the back side of the gallium nitride substrate. Thereafter, a blue LED chip A 500 μm square is produced.

Figure 3:
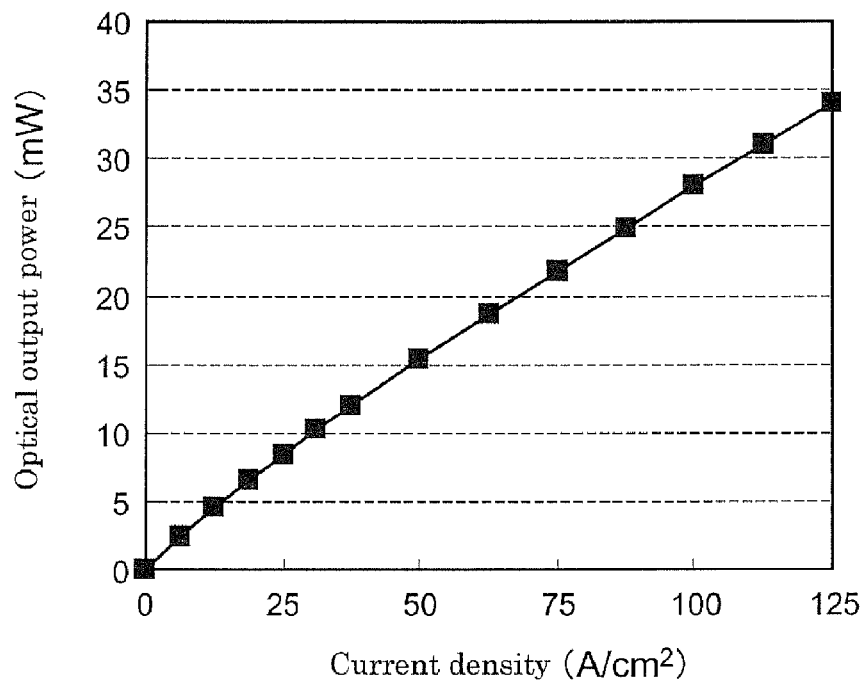
FIG. 3 is a graph demonstrating optical output—electric current characteristics of a blue LED chip A.
Figure 4:
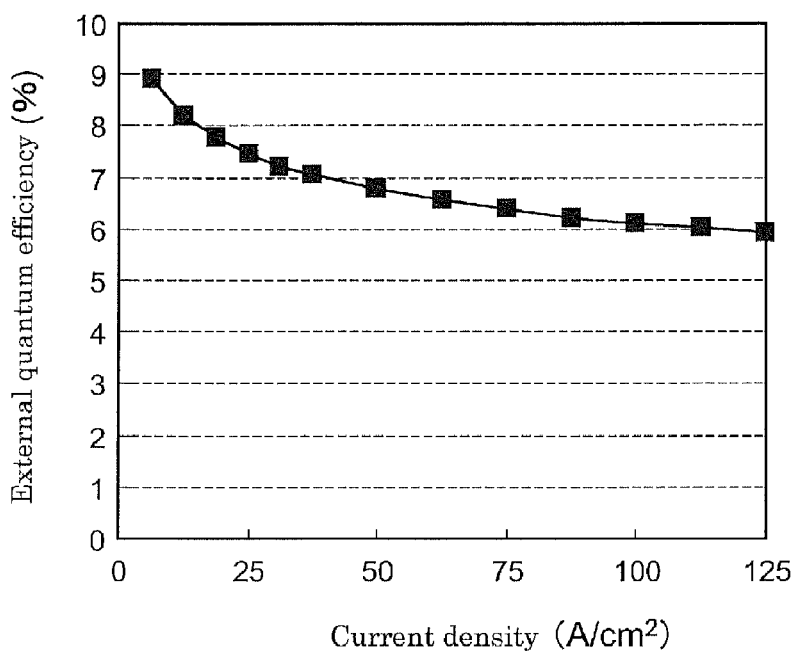
FIG. 4 is a graph demonstrating external quantum efficiency—electric current characteristics of the blue LED chip A.

FIG. 3 is a diagram representing optical output power—electric current characteristics in the blue LED chip A. FIG. 4 is a diagram representing external quantum efficiency—electric current characteristics in the blue LED chip A. These measurements are obtained by measuring optical output power with pulse current being applied to the blue LED chip at room temperature. The measurement results demonstrates that the blue LED chip A shows emission spectrum (that is substantially a single peak) having peak wavelength of 450 nm when current of 20 mA (current density: 12.5 A/cm$^2$) is applied. The optical output power is 4.6 mW, and the external quantum efficiency is 8.2%. Furthermore, the blue LED chip A shows emission spectrum (that is substantially a single peak) having peak wavelength of 438 nm when current of 200 mA (current density: 125 A/cm$^2$) is applied. The optical output power is 34 mA, and the external quantum efficiency is 5.9%. The external quantum efficiency at current density of 12.5 A/cm$^2$ is 72% of the external quantum efficiency current density of 125 A/cm$^2$. A drive voltage at current density of 12.5 A/cm$^2$ is 3.6 volts. The LED chip A is sealed with epoxy resin to create a LED lamp. Such a LED lamp exhibits at current density of 125 A/cm$^2$ a 438 nm peak wavelength, 170 mW optical output power, and 30% external quantum efficiency.

EXPERIMENTAL EXAMPLE 2

Thin Well Layer

Figure 5:
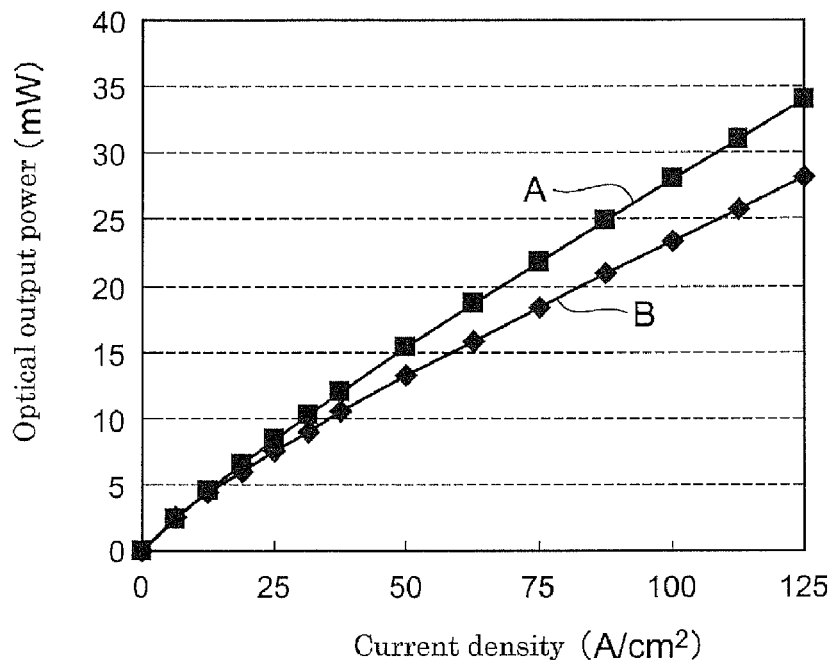
FIG. 5 is a graph demonstrating optical output—electric current characteristics of a blue LED chip B.
Figure 6:
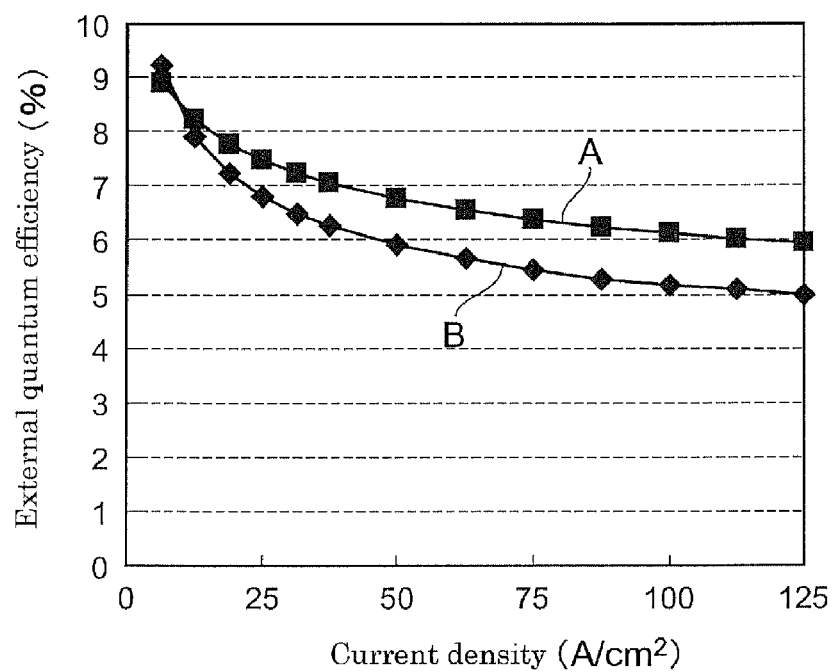
FIG. 6 is a graph demonstrating external quantum efficiency—electric current characteristics of the blue LED chip B.

Apart from the well layer composition and thickness, as in the case of Experimental Example 1, a blue light emitting diode is produced. The well layer composition (strained composition) is composed of $In_{0.14}Ga_{0.86}N$ (relaxation composition: $In_{0.22}Ga_{0.78}N$), and has thickness of 3 nm. In the same manner as in Experimental Example 1, a blue LED chip B is produced. FIG. 5 is a diagram representing external quantum efficiency—electric current characteristics in the blue LED chip B. Herein, for reference, FIGS. 5 and 6 demonstrate also optical output power—electric current characteristics and external quantum efficiency—electric current characteristics in the blue LED chip B. These results shows that the blue LED chip B exhibits emission spectrum (that is substantially a single peak) having peak wavelength of 448 nm when current of 20 mA (current density: 12.5 A/cm$^2$) is applied. The optical output power is 4.4 mW, and the external quantum efficiency is 7.9%. Furthermore, the blue LED chip B exhibits an emission spectrum (that is substantially a single peak) having a peak wavelength of 439 nm when current of 200 mA (current density: 125 A/cm$^2$) is applied. The optical output power is 28 mW, and external quantum efficiency is 5.0%. The external quantum efficiency at current density of 12.5 A/cm$^2$ is 63% of the external quantum efficiency at current density of 125 A/cm$^2$. The drive voltage at current density of 12.5 A/cm$^2$ is 3.2 volts. The LED chip A is was sealed with epoxy resin to create a LED lamp. The LED lamp exhibits at current density of 125 A/cm$^2$ 439 nm peak wavelength, 140 mW optical output power, and 25% external quantum efficiency.

EXPERIMENTAL EXAMPLE 3

Sapphire Substrate

A blue light emitting diode is produced by metal-organic vapor phase epitaxy. Trimethyl gallium (TMGa), trimethylammonium (TMAl), trimethyl indium (TMIn), ammonia (NH$_3$) monosilane (SiH$_4$), and cyclopentadienyl magnesium (Cp$_2$Mg) are available as row materials. A c-plane sapphire substrate is prepared. The sapphire substrate is placed on a susceptor of the metal-organic vapor phase epitaxy reactor. Next, a GaN buffer layer is formed on the sapphire substrate. The GaN buffer layer is grown at substrate temperature of 500 degrees centigrade by supplying source gases (TMGa, NH$_3$, and H$_2$) to the metal-organic vapor phase epitaxy reactor. Subsequently, the substrate temperature is changed to 1100 degrees centigrade, and then an n-type GaN buffer layer 5 μm in thickness is grown at growth rate of 4 μm/h, employing the source gases (TMGa, TMAl, NH$_3$, and SiH$_4$). Continuously, barrier layers and well layers are grown alternately. In growing the barrier layers, after the substrate temperature is changed to 900 degrees centigrade at reactor pressure of 101 kPa, an un-doped $In_{0.01}Ga_{0.99}N$ layer 15 nm in thickness is deposited employing source gases (TMGa, TMIn, and NH$_3$). In growing the well layers, the substrate temperature is changed to 800 degrees centigrade at reactor pressure of 101 kPa, and then an un-doped $In_{0.11}Ga_{0.89}N$ layer 5 nm in thickness is deposited employing source gases (TMGa, TMIn, and NH$_3$). The well layer and barrier layer growths are repeated necessary times. In Experimental Example 3, a 6-growth-cycle quantum well structure is formed. The well layers and barrier layers are represented by strained compositions. After that, the substrate temperature is changed to 1050 degrees centigrade, and then a p-type $Al_{0.12}Ga_{0.88}N$ cladding layer 20 nm in thickness is grown employing source gases (TMGa, TMAl, NH$_3$ and Cp$_2$Mg). Next, a p-type GaN contact layer 150 nm in thickness is grown employing source gases (TMGa, TMAl, NH$_3$ and Cp$_2$Mg). As a result, a LED epitaxial substrate is completed.

Successively, the LED epitaxial substrate is removed from the metal-organic vapor phase epitaxy reactor, and an anode of a transparent electrode is created on the p-type contact layer. The size of the transparent electrode is 400 μm square (electrode area: 1.6×10$^{-3}$ cm$^2$). Additionally, an electrode of cathode is created on the back side of the gallium nitride substrate. After that, a blue LED chip C 500 μm square is thus produced.

Figure 7:
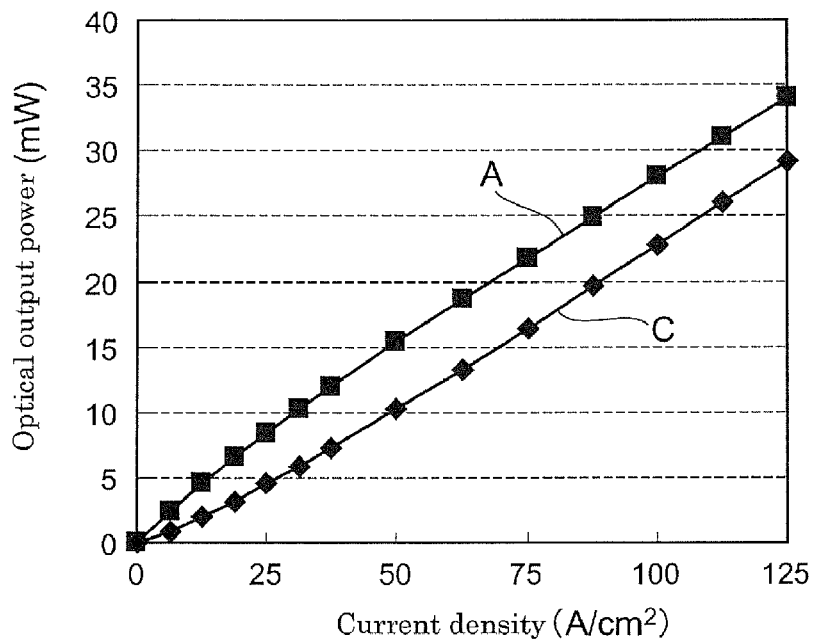
FIG. 7 is a graph demonstrating optical output—electric current characteristics of a blue LED chip C.
Figure 8:
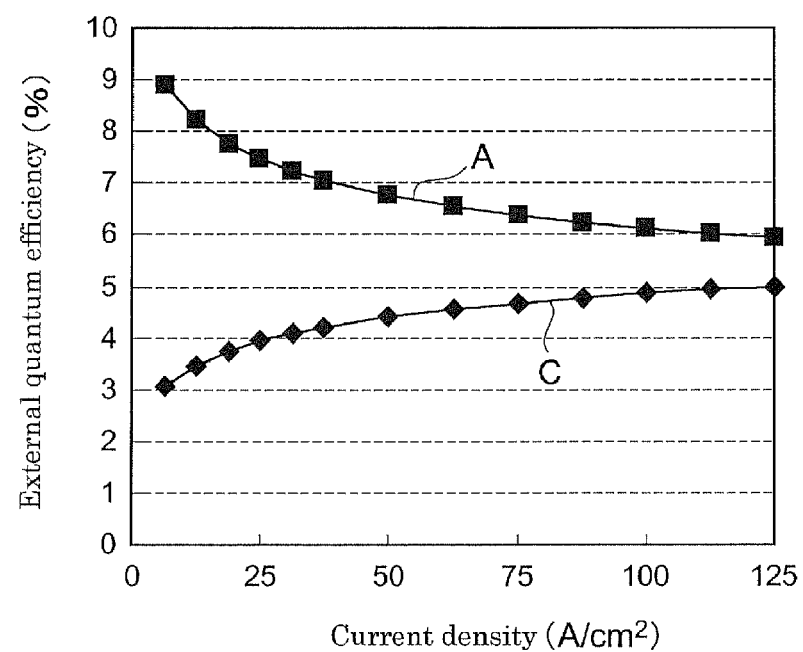
FIG. 8 is a graph demonstrating external quantum efficiency—electric current characteristics of the blue LED chip C.

FIG. 7 is a diagram representing optical output power—electric current characteristics in the blue LED chip C. FIG. 8 is a diagram representing external quantum efficiency—electric current characteristics in the blue LED chip C. Herein, for reference, FIGS. 7 and 8 demonstrate also optical output power—electric current characteristics and external quantum efficiency—electric current characteristics in the blue LED chip A. These results show that the blue LED chip C exhibits emission spectrum (that is substantially a single peak) having peak wavelength of 434 nm when current of 20 mA (current density: 12.5 A/cm$^2$) is applied. The optical output power is 2.0 mW, and the external quantum efficiency is 3.4%. Furthermore, the blue LED chip C exhibits emission spectrum (that is substantially a single peak) having a peak wavelength of 424 nm when current of 200 mA (current density: 125 A/cm$^2$) is. The optical output power is 29 mW, and external quantum efficiency is 5.0%. The external quantum efficiency at current density of 12.5 A/cm$^2$ is 68% of the external quantum efficiency at current density of 125 A/cm$^2$. The LED chip C is sealed with epoxy resin to create a LED lamp. This LED lamp exhibits at current density of 125 A/cm$^2$ 438 nm peak wavelength, 116 mW optical output power, and 20% external quantum efficiency. Luminous efficiency of the LED formed on the sapphire substrate is higher than that of the LED formed on the gallium nitride substrate, in comparing light extraction efficiencies of the LEDs before they are sealed.

EXPERIMENTAL EXAMPLE 4

Well Layer Growth Temperature is Same as Barrier Layer Growth Temperature

Apart from the well layer composition and thickness, as in the case of Experimental Example 1, a blue light emitting diode is produced. In blue LED chip D, its optical output power is 1 mW or less when electric current of 20 mA (current density: 12.5 A/cm$^2$) is applied.

EXPERIMENTAL EXAMPLE 5

Barrier Layer Doped with Si

Apart from doping Si to, and growing, an $In_{0.01}Ga_{0.99}N$ barrier layer 15 nm in thickness, as in the case of Experimental Example 1, a blue light emitting diode is produced. The optical output power—electric current characteristics and external quantum efficiency—electric current characteristics of a blue LED chip E are almost same with those of the blue LED chip A of the Experimental Example 1. The drive voltage at current density of 12.5 A/cm$^2$ is 3.2 volts.

EXPERIMENTAL EXAMPLE 5

Low-Dislocation Sapphire Template

A blue light emitting diode is produced by metal-organic vapor phase epitaxy. After a low-temperature buffer layer is formed onto a sapphire substrate, a gallium nitride epitaxial layer is formed. A selective growth mask composed of $SiO_2$ is formed onto the gallium nitride epitaxial layer. Gallium nitride is laterally overgrown employing the mask by metal-organic vapor phase epitaxy. The grown gallium nitride region includes a region having a threading dislocation density of 1×10$^7$ cm$^{-2}$ or less. As in the case of Experimental Example 5, a blue light emitting diode is produced. On the region having a threading dislocation density of 1×10$^7$ cm$^{-2}$ or less, an anode (a 1.6×10$^{-3}$ cm$^2$ transparent electrode) is created, and a cathode electrode is created on the n-GaN layer exposed due to dry etching. The optical output power—electric current characteristics, external quantum efficiency—electric current characteristic, emission wavelength, and drive voltage at current density of 12.5 A/cm$^2$ of the blue LED chip F are almost same with those of the blue LED chip E.

EXPERIMENTAL EXAMPLE 7

SiC Substrate

A blue light emitting diode is produced by metal-organic vapor phase epitaxy. An AlN buffer layer is grown onto a conductive SiC substrate, and then a gallium nitride epitaxial layer is formed. A selective growth mask composed of $SiO_2$ is formed onto the gallium nitride epitaxial layer. Gallium nitride is laterally overgrown employing the mask by metal-organic vapor phase epitaxy. The grown gallium nitride region includes a region having a threading dislocation density of 1×10$^7$ cm$^{-2}$ or less. As in the case of Experimental Example 5, a blue light emitting diode is produced. An anode (a 1.6×10$^{-3}$ cm$^2$ transparent electrode) is created on the region having a threading dislocation density of 1×10$^7$ cm$^{-2}$ or less, and a cathode electrode is created on the back side of the SiC substrate. The optical output power—electric current characteristics, external quantum efficiency—electric current characteristic, emission wavelength, and drive voltage at current density of 12.5 A/cm$^2$ of the blue LED chip G are almost same with those of the blue LED chip E.

EXPERIMENTAL EXAMPLE 8

Dependence of Well Layer on Indium Composition

Figure 9:
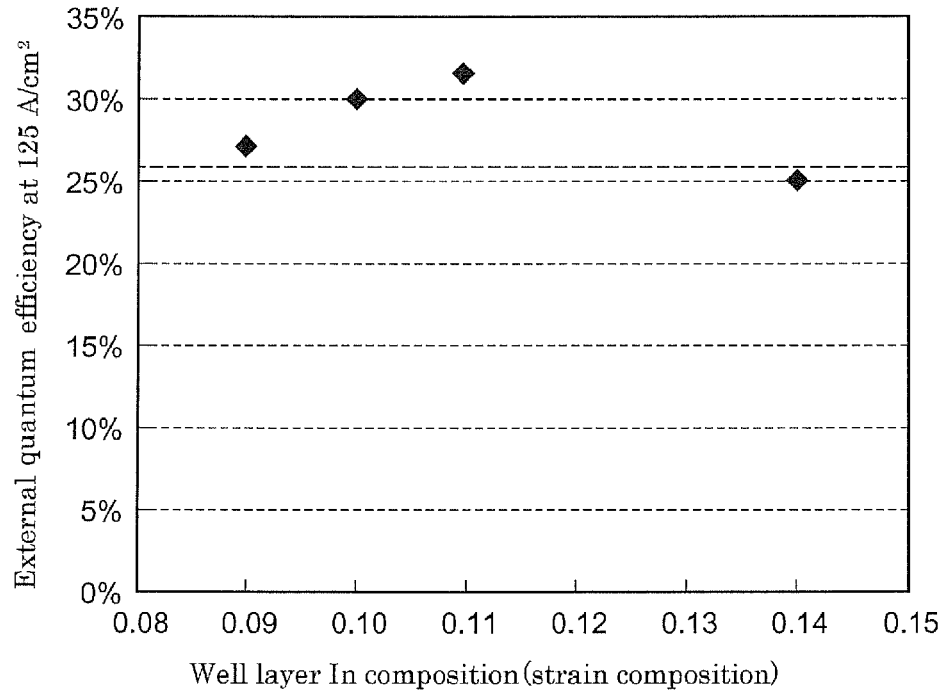
FIG. 9 is a graph demonstrating dependence of external quantum efficiency at current density of 125 A/cm$^2$ on indium composition.
Figure 10:
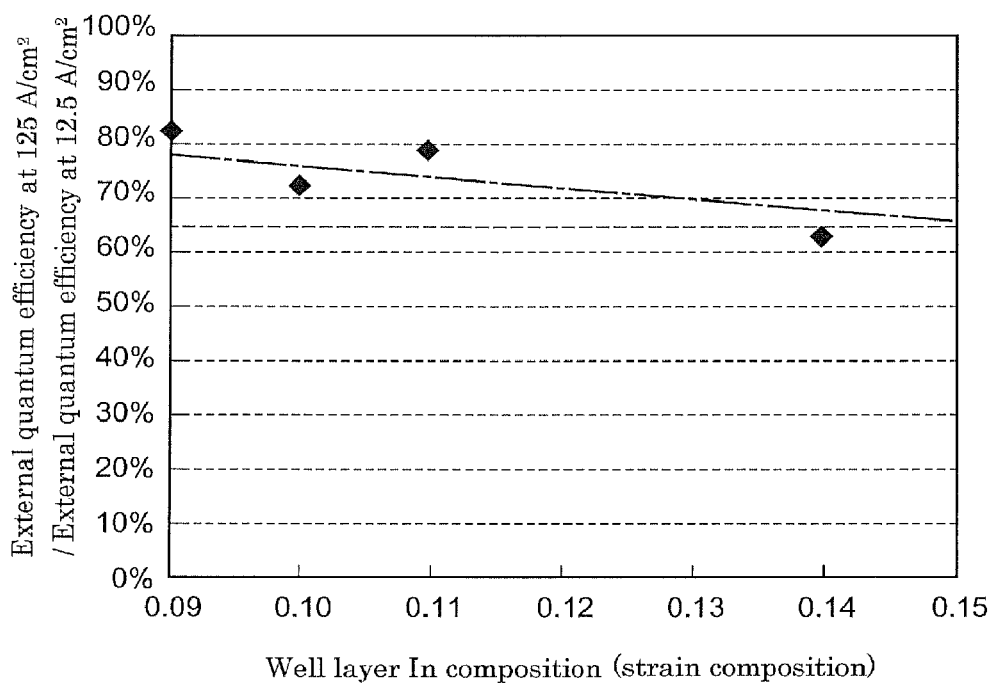
FIG. 10 is a graph demonstrating dependence of percentage of external quantum efficiency at current density of 125 A/cm² to external quantum efficiency at current density of 12.5 A/cm² on indium composition.

Blue LED chips having well layers that differ in indium composition are produced on the manufacturing conditions of Experiment Example 1. FIG. 9 is a diagram representing dependence of external quantum efficiency at current density of 125 A/cm$^2$ on indium composition. FIG. 10 is a diagram representing dependence of ratio (percentage) of the external quantum efficiency at current density of 125 A/cm$^2$ to the external quantum efficiency at current density of 12.5 A/cm$^2$ on the indium composition. Referring to FIG. 10, the ratio of the external quantum efficiency increases with lowering indium composition. The ratio is 63.3%, 79.0%, 72.3%, and 82.3% respectively at indium composition of 0.14, 0.11, 0.10, and 0.09. The ratio is about 65% when the indium composition is 0.14. Nevertheless, superior properties are obtained in the well layers with an indium composition of 0.14 or less because the ratios are more than 65% when the indium compositions are other than 0.14. The reason why the ratio 65% is regarded as standard is that 65% is general ratio for the typical blue LEDs.

EXPERIMENTAL EXAMPLE 9

Dependence of Well Layer on Thickness

Figure 11:
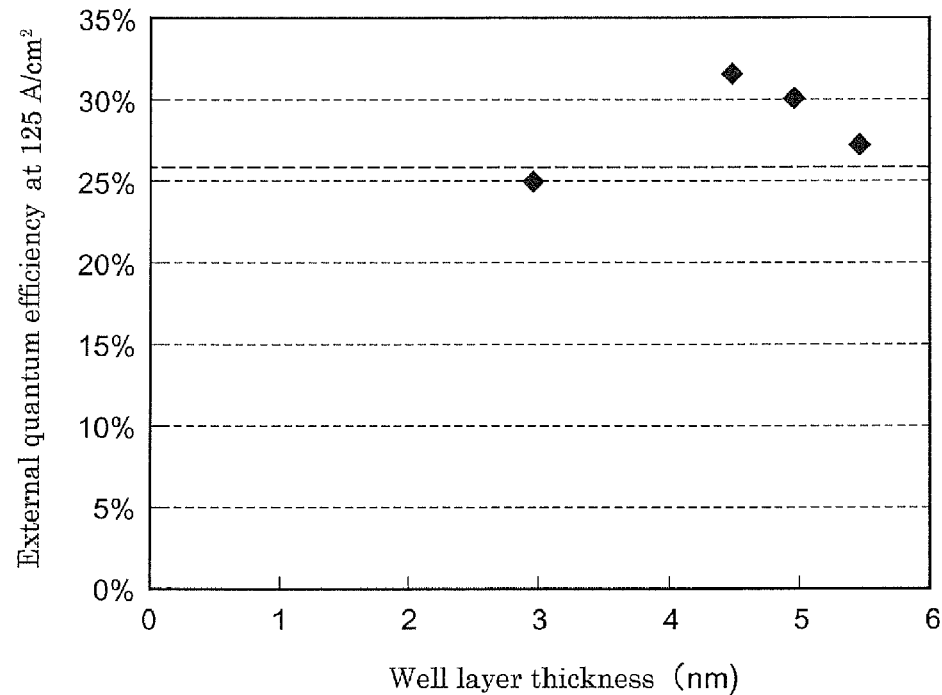
FIG. 11 is a graph demonstrating dependence of external quantum efficiency at current density of 125 A/cm² on well layer thickness.
Figure 12:
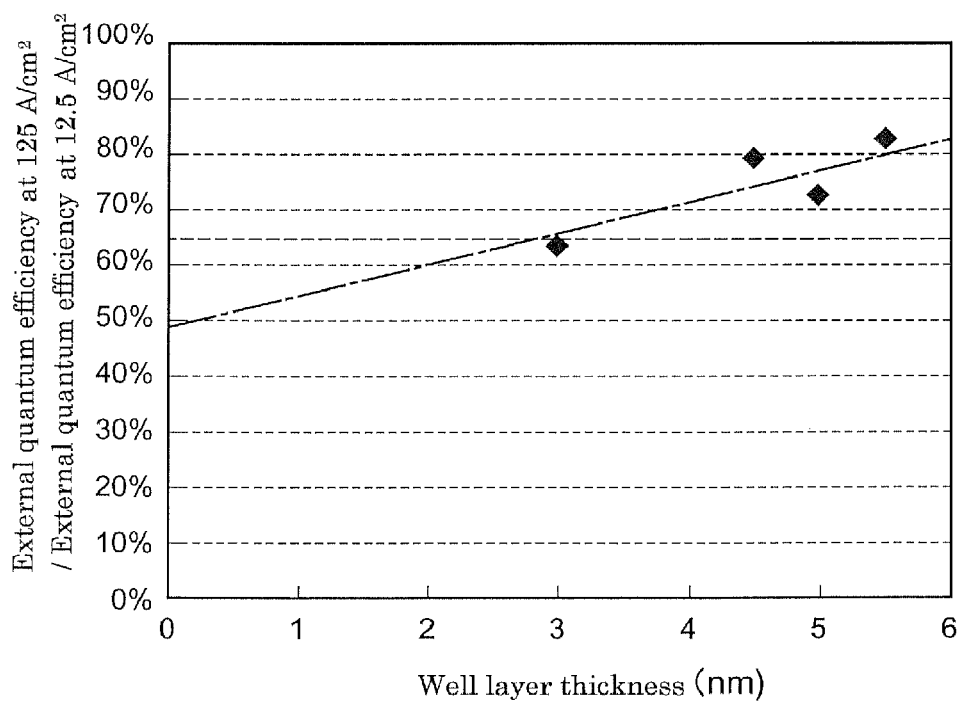
FIG. 12 is a graph demonstrating dependence of percentage of external quantum efficiency at current density of 125 A/cm² to external quantum efficiency at current density of 12.5 A/cm² on well layer thickness.

Blue LED chips having well layers that differ in thickness are produced on the manufacturing conditions of Experiment Example 1. FIG. 11 is a diagram representing dependence of external quantum efficiency at current density of 125 A/cm$^2$ on well layer thickness. FIG. 12 is a diagram representing dependence of ratio (percentage) of the external quantum efficiency at current density of 125 A/cm$^2$ to the external quantum efficiency at current density of 12.5 A/cm$^2$ on the well layer thickness. Referring to FIG. 12, the ratio of the external quantum efficiency rises with the increasing well layer thickness. The ratio is 63.3%, 79.0%, 72.3%, and 82.3% respectively at well layer thicknesses of 3 nm, 4.5 nm, 5 nm, and 5.5 nm. The ratio is about 65% when the well layer thickness is 3 nm. Nevertheless, because the ratios are more than 65% when the well layer thicknesses are other than 3.5 nm, a well layer 4 nm in thickness is preferable in consideration of the results of other experiments that inventors carried out.

EMBODIMENT 2

Figure 13A:
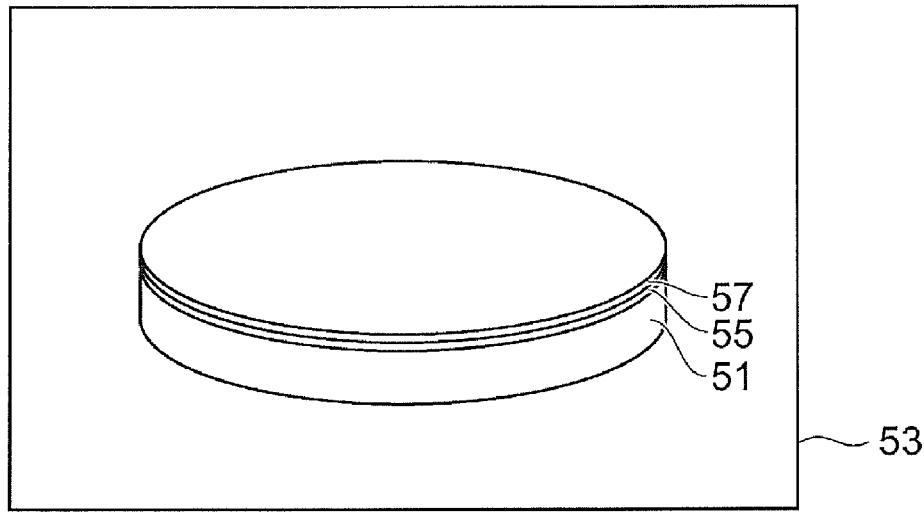
FIGS. 13A and 13B are diagrams representing the semiconductor light-emitting device manufacturing method involving the embodiment of the present invention.

FIGS. 13A, 13B, 14A and 14B are drawings illustrating a semiconductor light-emitting device manufacturing method involving the present invention. An n-type gallium nitride substrate 51 with a threading dislocation density of 1×10$^7$ cm$^{-2}$ or less is prepared. The gallium nitride substrate 51 is placed on a susceptor of a metal-organic vapor phase epitaxy reactor 53. As illustrated in FIG. 13A, an n-type AlGaN film 55 is grown onto the gallium nitride substrate 51 employing the metal-organic vapor phase epitaxy reactor 53. An n-type gallium nitride semiconductor layer 57 is grown onto the AlGaN film 55. Depositing the AlGaN film 55 prior to the gallium nitride semiconductor film 57 provides a front side more suitable for the growth of a gallium nitride semiconductor film 57, compared with the front side of the gallium nitride substrate 51. Because the gallium nitride substrate 51 is used, the treading dislocation density of the gallium nitride semiconductor film 57 is 1×10$^7$ cm$^{-2}$ or less.

Figure 13B:
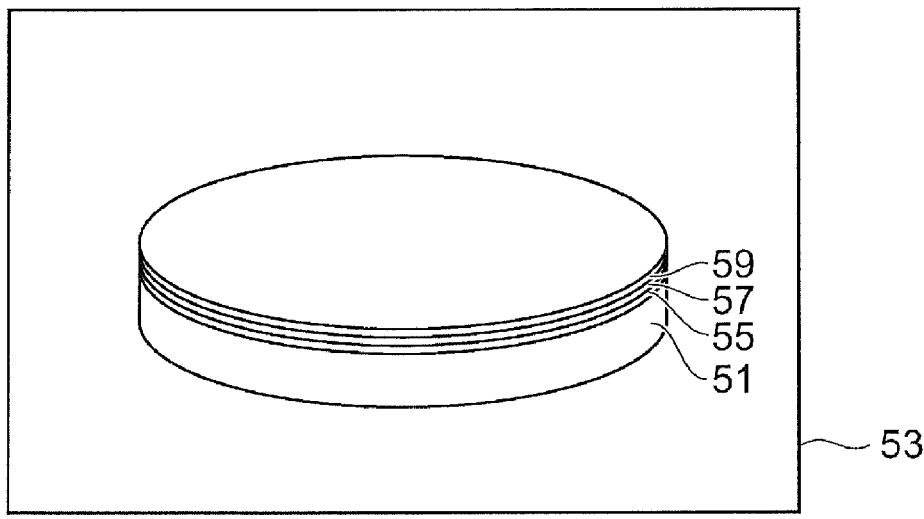

As illustrated in FIG. 13B, an active region 59 is formed onto the gallium nitride semiconductor film 57. The active region 59 has a quantum well structure, and the quantum well structure is provided so as to emit light having a peak wavelength within the wavelength range of 420 nm to 490 nm inclusive. Well layers in the quantum well structure include un-doped $In_xGa_{1-x}N$ (0<X<0.14, X: strained composition), and barrier layers in the quantum well structure include un-doped $In_YGa_{1-Y}N$ (0≦Y≦0.05, Y: strained composition, Y<X). A temperature (for example, 800 degrees of centigrade) at which the well layers are deposited is lower than that (for example, 900 degrees centigrade) at which the barrier layers are deposited. The well layer deposition temperature is preferably, for example, 750 degrees centigrade or more, and preferably is 850 degrees centigrade or less, for example. The barrier layer deposition temperature is preferably 850 degrees centigrade or more, and preferably 950 degrees centigrade or less, for example.

It should be understood that as the barrier layers in the quantum well structure, in place of un-doped $In_YGa_{1-Y}N$ (0≦Y≦0.05, Y: strained composition, Y<X) region, an $In_YGa_{1-Y}N$ (0≦Y≦0.05, Y: strained composition, Y<X) region to which n-type dopant is added may be used.

Furthermore, the well layer thickness is preferably 4 nm or more, and preferably is 10 nm or less.

With this method, the In compositional fluctuations can be curved by making the well layer deposition temperature lower than the barrier layer deposition temperature, and by lowering the well layer In composition. Lowering the In composition of the well layer reduces the number of the localized levels originating in the In compositional fluctuations. The reduction of the localized levels, however, causes the active region to seriously suffer from the impact of dislocations instead. In other words, crystallinity of the active region 59 becomes sensitive to the treading dislocation densities of the active region 59 and an underlayer 57. Furthermore, just lowering the well layer In composition causes emission wavelength shifting. Preventing the shifting and obtaining emission with a wavelength of 420 nm to 490 nm inclusive require increasing the well layer thickness. Increasing the well layer thickness spoils the crystallinity of the InGaN well layers. Because the threading dislocation density of the underlayer 57 is brought to $1\times10^7$ cm$^{-2}$ or less, the impact of the active regions' sensitivity to dislocations and of thickening the well layers can be lessened. As a result, a decrease in the external quantum efficiency at high current densities can be curbed.

Figure 14A:
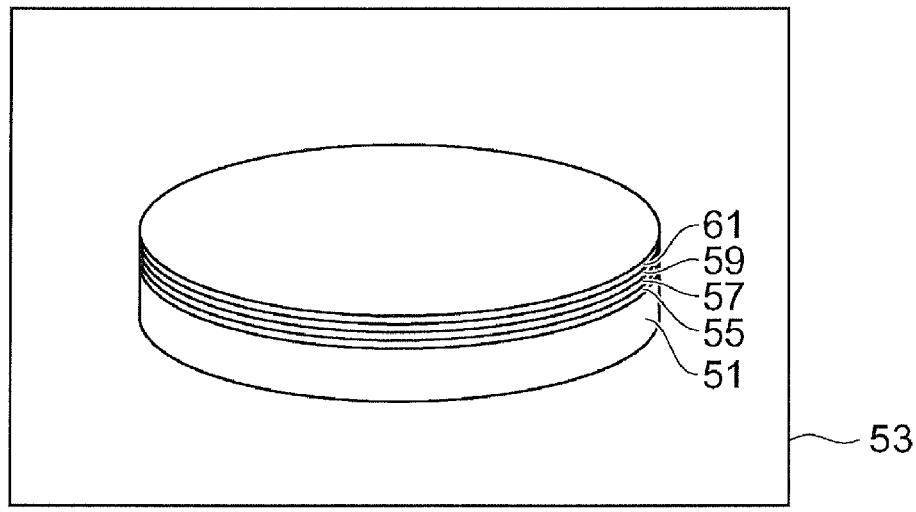
FIGS. 14A and 14B are diagrams representing the semiconductor light-emitting device manufacturing method involving the embodiment of the present invention.

As illustrated in FIG. 14A, a p-type gallium nitride semiconductor film 61 is grown onto the active region 59 employing metal-organic vapor phase epitaxy reactor 53. The p-type gallium nitride semiconductor film 61 may be composed of, for example, GaN or AlGaN. Band gap energy of the p-type gallium nitride semiconductor film 61 and the n-type gallium nitride semiconductor film 57 is larger than that of the well layers in the active region 59. For this reason, the p-type gallium nitride semiconductor film 61 and the n-type gallium nitride semiconductor film 57 serve as cladding layers.

Figure 14B:
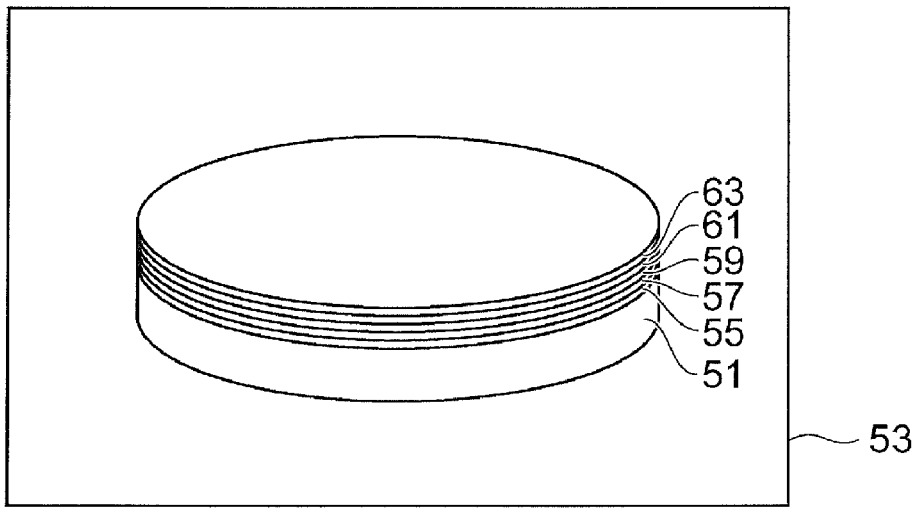

As illustrated in FIG. 14B, a p-type gallium nitride semiconductor film 63 is grown onto the p-type gallium nitride semiconductor film 61 employing metal-organic vapor phase epitaxy reactor 53. The p-type gallium nitride semiconductor film 63 may be composed of, for example, InGaN, GaN or AlGaN. As just described, according to the embodiment of the present invention, a method of manufacturing the semiconductor light-emitting devices in which a decrease in the external quantum efficiency has been minimized also at high current densities can be made available.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents. In the embodiments, examples of the substrate include GaN substrate, sapphire template, SiC substrate, though the substrate is not limited to them, so AlN and $ZrB_2$ may be also employed.

What is claimed is:

1. A semiconductor light-emitting device, comprising:
   a gallium nitride cladding layer of a first conductivity type, with a threading dislocation density of $1\times10^7$ cm$^{-2}$ or less;
   a gallium nitride cladding layer of a second conductivity type; and
   an active region, having a quantum well structure composed of a plurality of well layers and a plurality of barrier layers, provided between the first-conductivity-type and the second-conductivity-type gallium nitride cladding layers; wherein
   the quantum well structure is provided so as to emit light having a peak wavelength within a wavelength range of 420 nm to 490 nm inclusive,
   the well layers each include an un-doped $In_xGa_{1-x}N$ (0<X<0.14, X: strained composition) region, and
   the barrier layers include an un-doped $In_YGa_{1-Y}N$ (0≦Y≦0.05, Y: strained composition, Y<X) region.

2. A semiconductor light-emitting device, comprising:
   a gallium nitride cladding layer of a first conductivity type, with a threading dislocation density of $1\times10^7$ cm$^{-2}$ or less;
   a gallium nitride cladding layer of a second conductivity type; and
   an active region, having a quantum well structure composed of a plurality of well layers and a plurality of barrier layers, provided between the first-conductivity-type and the second-conductivity-type gallium nitride cladding layers; wherein
   the quantum well structure is provided so as to emit light having a peak wavelength within a wavelength range of 420 nm to 490 nm inclusive,
   the well layers each include an un-doped $In_xGa_{1-x}N$ (0<X<0.14, X: strained composition) region, and
   the barrier layers include an $In_YGa_{1-Y}N$ (0≦Y≦0.05, Y: strained composition, Y<X) region to which n-type dopant is added.

3. A semiconductor light-emitting device as set forth in claim 1 or claim 2, wherein the well layers are each 4 nm or more in thickness.

4. A semiconductor light-emitting device as set forth in claim 1 or claim 2, further comprising:
   a III-nitride substrate having a basal plane; and
   a semiconductor region composed of said first-conductivity-type gallium nitride cladding layer, active region, and second-conductivity type gallium nitride cladding layer, and provided on said III-nitride substrate basal plane.

5. A semiconductor light-emitting device as set forth in claim 4, wherein the III-nitride substrate is $1\times10^7$ cm$^{-2}$ or less in threading dislocation density.

6. A semiconductor light-emitting device as set forth in claim 4, wherein the III-nitride substrate is a gallium nitride substrate with a threading dislocation density of $1\times10^7$ cm$^{-2}$ or less.

* * * * *